(12) United States Patent
Song et al.

(10) Patent No.: US 10,368,432 B2
(45) Date of Patent: Jul. 30, 2019

(54) CIRCUIT ASSEMBLIES AND RELATED METHODS

(71) Applicant: Laird Technologies, Inc., Chesterfield, MO (US)

(72) Inventors: John Song, Barrington, IL (US); George William Rhyne, Greensboro, NC (US)

(73) Assignee: LAIRD TECHNOLOGIES, INC., Chesterfield, MO (US)

( * ) Notice: Subject to any disclaimer, the term of this patent is extended or adjusted under 35 U.S.C. 154(b) by 0 days.

(21) Appl. No.: 16/003,626

(22) Filed: Jun. 8, 2018

(65) Prior Publication Data
US 2018/0295713 A1    Oct. 11, 2018

Related U.S. Application Data

(63) Continuation of application No. 15/783,191, filed on Oct. 13, 2017, now Pat. No. 9,999,122, which is a
(Continued)

(51) Int. Cl.
*H05K 9/00* (2006.01)
*H05K 1/02* (2006.01)
(Continued)

(52) U.S. Cl.
CPC ......... *H05K 1/0216* (2013.01); *H05K 1/0296* (2013.01); *H05K 1/14* (2013.01);
(Continued)

(58) Field of Classification Search
CPC . H05K 9/00; H05K 9/0024; H05K 2201/0715
See application file for complete search history.

(56) References Cited

U.S. PATENT DOCUMENTS

| 5,166,864 A | 11/1992 | Chitwood |
| 6,055,722 A * | 5/2000 | Tighe ..................... H01R 12/62 29/839 |

(Continued)

FOREIGN PATENT DOCUMENTS

| JP | 2009094119 A | 4/2009 |
| WO | WO-2016167854 A1 | 10/2016 |

OTHER PUBLICATIONS

International Search Report and Written Opinion dated May 24, 2016 for PCT Application No. PCT/US2016/014739 filed Jan. 25, 2016 which is the parent application to the instant application, 11 pages.

(Continued)

*Primary Examiner* — Hung V Ngo
(74) *Attorney, Agent, or Firm* — Harness, Dickey & Pierce, P.L.C.; Anthony G. Fussner

(57) ABSTRACT

In exemplary embodiments, a circuit assembly may be provided on and/or supported by an electrically conductive structure, such as a board level shield, a midplate, a bracket, a precision metal part, etc. For example, a circuit assembly may be provided on and/or supported by an outer top surface of a board level shield. In an exemplary embodiment, an assembly generally includes an electrically conductive structure configured for a first functionality in the electronic device. An electrically nonconductive material is on at least part of the electrically conductive structure. First electrical component(s) are at least partly on the electrically nonconductive layer and configured to define at least a portion of a circuit assembly for electrical connection with one or more second electrical components of the electronic device. The electrically conductive structure may thus be configured for a second functionality in the electronic device.

20 Claims, 2 Drawing Sheets

Related U.S. Application Data continuation-in-part of application No. PCT/US2016/014739, filed on Jan. 25, 2016, which is a continuation of application No. 14/704,115, filed on May 5, 2015, now abandoned.

(60) Provisional application No. 62/147,424, filed on Apr. 14, 2015.

(51) Int. Cl.
    *H05K 1/18*     (2006.01)
    *H05K 3/30*     (2006.01)
    *H05K 1/14*     (2006.01)

(52) U.S. Cl.
    CPC ............... *H05K 1/18* (2013.01); *H05K 3/30* (2013.01); *H05K 9/0024* (2013.01); *H05K 2201/0183* (2013.01); *H05K 2201/0715* (2013.01); *H05K 2201/0999* (2013.01); *H05K 2201/10371* (2013.01)

(56) References Cited

U.S. PATENT DOCUMENTS

| | | |
|---|---|---|
| 7,177,161 B2 | 2/2007 | Shima |
| 8,379,408 B2 | 2/2013 | Hankui |
| 8,384,604 B2 | 2/2013 | Niederkorn et al. |
| 9,635,789 B2 | 4/2017 | English et al. |
| 9,999,122 B2 | 6/2018 | Song et al. |
| 2003/0193794 A1 | 10/2003 | Reis et al. |
| 2004/0155308 A1 | 8/2004 | McFadden et al. |
| 2006/0152913 A1 | 7/2006 | Richey |
| 2007/0209833 A1 | 9/2007 | English |
| 2009/0067149 A1 | 3/2009 | Bogursky et al. |
| 2010/0108370 A1 | 5/2010 | Kapusta et al. |
| 2015/0305144 A1 | 10/2015 | Tajima et al. |

OTHER PUBLICATIONS

Non-final Office Action dated Jun. 23, 2016 for U.S. Appl. No. 14/704,114 dated Jun. 23, 2016 which is the parent application to the instant application, 9 pages.

\* cited by examiner

CIRCUIT ASSEMBLIES AND RELATED METHODS

CROSS-REFERENCE TO RELATED APPLICATIONS

This application is a continuation of U.S. patent application Ser. No. 15/783,191 filed Oct. 13, 2017 (issuing on Jun. 12, 2018 as U.S. Pat. No. 9,999,122).

U.S. patent application Ser. No. 15/783,191 is a continuation-in-part of PCT Application No. PCT/US2016/014739 filed Jan. 25, 2016 (published as WO 2016/167854 on Oct. 2, 2016).

PCT Application No. PCT/US2016/014739 claims priority to and the benefit of U.S. Provisional Patent Application No. 62/147,424 filed Apr. 14, 2015 and U.S. patent application Ser. No. 14/704,115 filed May 5, 2015.

U.S. patent application Ser. No. 14/704,115 claims priority to and the benefit of U.S. Provisional Patent Application No. 62/147,424 filed Apr. 14, 2015.

The entire disclosures of the above applications are incorporated herein by reference.

FIELD

The present disclosure generally relates to circuit assemblies and related methods.

BACKGROUND

This section provides background information related to the present disclosure which is not necessarily prior art.

The operation of electronic devices generates electromagnetic radiation within the electronic circuitry of the equipment. Such radiation may result in electromagnetic interference (EMI) or radio frequency interference (RFI), which can interfere with the operation of other electronic devices within a particular proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. Where components are provided on a printed circuit board (PCB), a board level shield (BLS) may be installed over one or more PCB components.

SUMMARY

This section provides a general summary of the disclosure, and is not a comprehensive disclosure of its full scope or all of its features.

According to various aspects, exemplary embodiments are disclosed of circuit assemblies and related methods. In exemplary embodiments, a circuit assembly may be provided on and/or supported by an electrically conductive structure, such as a board level shield, a midplate, a bracket, a precision metal part, etc. For example, a circuit assembly may be provided on and/or supported by an outer top surface of a board level shield.

In an exemplary embodiment, an assembly suitable for use in an electronic device generally includes an electrically conductive structure configured for a first functionality in the electronic device. An electrically nonconductive material is on at least part of the electrically conductive structure. One or more first electrical components are at least partly on the electrically nonconductive material and configured to define at least a portion of a circuit assembly for electrical connection with one or more second electrical components of the electronic device. The electrically conductive structure may thus be configured for a second functionality in the electronic device in addition to the first functionality in the electronic device.

Also disclosed are exemplary embodiments of methods relating to making a circuit assembly suitable for use in an electronic device. In an exemplary embodiment, a method generally includes applying an electrically nonconductive material on at least part of an electrically conductive structure. The electrically conductive structure is configured to have a first functionality in the electronic device. The method also includes providing one or more first electrical components at least partly on the electrically nonconductive material. The method further includes configuring the one or more first electrical components for electrical connection with one or more second electrical components of the electronic device. The electrically conductive structure may thus be configured to have a second functionality in addition to the first functionality.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Figure 1:
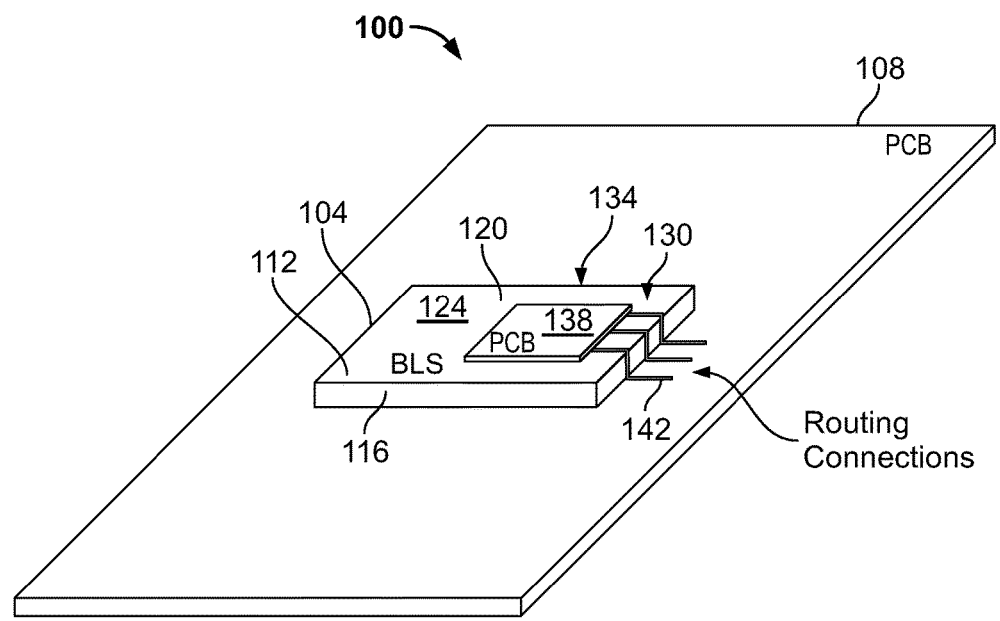
FIG. 1 illustrates an assembly in which there is a multi-layer circuit assembly including a flexible circuit along a portion of a board level shield (BLS) according to an exemplary embodiment.

Example embodiments will now be described more fully with reference to the accompanying drawings.

Designers of consumer electronics (e.g., smartphones, etc.) strive to make use of all available space inside electronic devices in order to make the devices as thin as possible. Accordingly, the inventors hereof sought to develop, have developed, and disclose herein exemplary embodiments of assemblies that make use of previously unused space to provide a more densely packed electronic device. One way of conserving space inside a device is to provide components that are multifunctional. For example, a smartphone may employ a board level shield (BLS) to provide EMI shielding and/or grounding of electrical components, which may be referred to as a first functionality of the BLS. In exemplary embodiments disclosed herein, the same BLS may also be used to support at least part of a multiple-layer or multilayer electrical circuit assembly. With this second functionality of supporting the electrical circuit assembly, the BLS may thus be multifunctional. Some other example embodiments include multifunctional smartphone mid-plate that is used to provide a ground plane and to isolate a screen from a battery and logic boards (a first functionality) and used to support at least part of a multiple-layer electrical circuit assembly (a second functionality). A mid-plate may also be referred to herein as a midplate, mid plate, middle deck, or support member. Additionally or alternatively, brackets, and/or other precision metal components can also serve to support at least part of a multilayer electrical circuit. In exemplary embodiments that include a bracket or a precision metal component, the first functionality of the bracket or precision metal component would be structural or mechanical (e.g. to fix another component in place or provide other mechanical function, etc.), and the second functionality would be supporting at least part of an electrical circuit assembly.

In some exemplary embodiments, a circuit assembly is provided that is suitable for use in an electronic device, such as a smartphone, etc. The circuit assembly includes an electrically conductive structure, e.g., a BLS, mid-plate, bracket, other precision metal part, etc. In one example embodiment, an electrically nonconductive material (e.g., a layer or coating of dielectric material or nonconductive paint, etc.) covers at least part of an outer surface of a BLS. The electrically nonconductive material may be thermally conductive in some exemplary embodiments. One or more first electrical components are provided at least partly on (e.g., stacked on, etc.) the electrically nonconductive material. The one or more first electrical components are configured for routing signals and/or for electrical connection with one or more second electrical components provided, e.g., on a substrate, on a printed circuit board (PCB) onto which the BLS is configured to be installed, etc. In various embodiments, the first electrical component(s) could be configured for electrical connection with second electrical component(s) provided directly on the PCB and/or on another substrate. Additionally or alternatively, the first electrical component(s) could be configured for electrical connection with second electrical component(s) provided elsewhere in the circuit assembly.

By way of example, a multiple-layer circuit assembly may have x and y dimensions similar to the dimensions of a BLS dimensions, e.g., on the order of 2 millimeters (mm), etc. The z dimension of the multiple-layer circuit assembly may be on the order of a few mils. Exemplary embodiments disclosed herein may be used to avoid having to add another circuit board that would take up more space inside the smartphone or other electronic device. Accordingly, exemplary embodiments disclosed herein may allow for a better use of the existing space in three dimensions.

Some exemplary embodiments include an electrically nonconductive or dielectric material that is thermally conductive. These exemplary embodiments may have a third functionality, which is defining or providing part of a thermally-conductive heat path from a heat source to a heat dissipating device or component.

FIG. 1 illustrates an exemplary embodiment of an assembly 100 for an electronic device such as smartphone, tablet, etc. The assembly 100 includes an electrically conductive structure. In this example, the electrically conductive structure is a board level shield (BLS) 104 attached to a substrate 108 (e.g., a printed circuit board (PCB), etc.). In other embodiments, the electrically conductive structure may comprise a mid-plate, a bracket, a metal precision piece, etc.

As shown in FIG. 1, the BLS 104 includes a cover 112 (broadly, a top or upper surface) and sidewalls 116 depending from (e.g., attached to, integrally connected with, etc.) the cover 112. The sidewalls 116 are configured for installation to the substrate 108 generally about one or more components (not shown) on the substrate 108 such that the component(s) are under the BLS 104 and/or within an interior or shielding enclosure cooperatively defined by the sidewalls 116 and the cover 112. When the BLS 104 is installed (e.g., soldered, etc.) on the substrate 108, the BLS 104 is operable for shielding the component(s) that are within the interior or shielding enclosure cooperatively defined by the sidewalls 116 and the cover 112. The BLS 104 may also serve as a ground plane. In various embodiments, a BLS cover and one or more sidewalls depending from the cover are formed from a single piece of electrically conductive material such that the BLS cover and the sidewall(s) have a monolithic or single piece construction. Alternative embodiments may include a multipiece BLS in which the cover or upper surface may be made separately and not integrally with the sidewalls. In some embodiments, the BLS may comprise a two-piece shield in which the shield's cover or lid is removable from and reattachable to the sidewalls.

An electrically nonconductive or dielectric material 120 is applied to at least part of one or more outer surfaces 124 of the cover 112 and/or sidewalls 116 of the BLS 104. The electrically nonconductive material may be thermally conductive in some exemplary embodiments. In other exemplary embodiments, the electrically nonconductive material may be a thermal insulator.

Electrically conductive material 130 is provided at least partly on the nonconductive material 120. The electrically conductive material 130 is configured to define at least a portion of a circuit assembly for connection with one or more components of the electronic device. The electrically conductive material 130 may also define and/or be referred to herein as one or more electrical components 130 ("first electrical components").

The dielectric material 120 may be a relatively thin dielectric coating or layer that is applied via ink jet printing, spraying, painting, etc. The dielectric material 120 (e.g., a dielectric coating, electrical insulation, etc.) provides electrical isolation between the BLS 104 and the electrically conductive material 130. The dielectric material 120 acts as an intermediary between the BLS 104 and the electrically conductive material 130 to prevent direct contact between the BLS 104 and the electrically conductive material 130. By way of example, a dielectric coating may be deposited or dispensed along the outer surface of the BLS 104, e.g., via an ink jet process, print nozzle, or other suitable process. The dielectric coating may then be cured with ultraviolet light, etc. In an exemplary embodiment, the dielectric coating may provide electrical resistance greater than 4 gigaohms at 1000 volts with a 1 mm probe tip diameter and 100 gram weight. The dielectric coating may capable of withstanding or surviving lead-free reflow temperatures, such as a temperature of at least 260 degrees Celsius (e.g., 300 degrees Celsius, 350 degrees Celsius, etc.). The dielectric coating may comprise a blend of polymers, with acrylate polymers as the primary component, along with other components urethane, polyester and polyvinyl polymers, photo initiators, and other additives, etc. The dielectric coating may be disposed along the entire outer surface of the BLS or along only portions of the outer surface of the BLS. For example, the dielectric coating may be disposed along the outer surface of the cover 112 and one sidewall 116, along the cover 112 and two opposing sidewalls, or along the cover 112 and all four sidewalls 116. The dielectric coating may have a thickness of about 15 microns, less than 15 microns, or greater than 15 microns. The dielectric coating may be thermally conductive in some exemplary embodiments.

The dielectric material 120 may be provided at least partly along and/or over the outward-facing exposed surface(s) 124 of the BLS 104, such that the dielectric material 120 is situated between the BLS 104 and the first electrical component(s) 130 provided at least partly on the electrically nonconductive or dielectric material 120. The dielectric material 120 inhibits the BLS 104 from directly contacting and electrically shorting the first electrical component(s) 130.

In this example, the first electrical component(s) 130 include a flexible circuit 134 provided at least in part on a flexible PCB 138. The flexible circuit 134 may be made of materials including, e.g., polyimide film (such as Kapton polyimide, etc.), adhesive, metal foil, etc. The flexible PCB 138 is mounted on the cover 112 of the BLS 104. Connectors 142 extend from the flexible PCB 138, e.g., over one of the sidewall(s) 116. The connectors 142 may be patterned onto the electrically nonconductive material 120 on the BLS cover 112 and sidewall 116, e.g., with electrically conductive paint and/or other electrically conductive material. The connectors 142 may be used to electrically connect the flexible circuit 134 with various electrical components ("second electrical components") (not shown in FIG. 1) including, e.g., one or more second electrical components installed directly on the PCB 108, installed on another PCB, installed on the BLS 104, installed apart from the PCB 108, installed on other component(s) elsewhere in the circuit assembly 100, etc.

In some exemplary embodiments, the electrically nonconductive or dielectric material 120 may also be thermally conductive. In these exemplary embodiments, the assembly 100 may have a third functionality as it can be used to help define or provide part of a thermally-conductive heat path from a heat source to a heat dissipating device or component (e.g., a heat spreader, a heat sink, a heat pipe, a device exterior case or housing, etc.). For example, a thermally conductive heat path may be defined from one or more heat generating components disposed under the BLS 104 through the BLS cover 112 and/or sidewalls 116 and thermally-conductive dielectric material 120 to a heat dissipating device.

Figure 2:
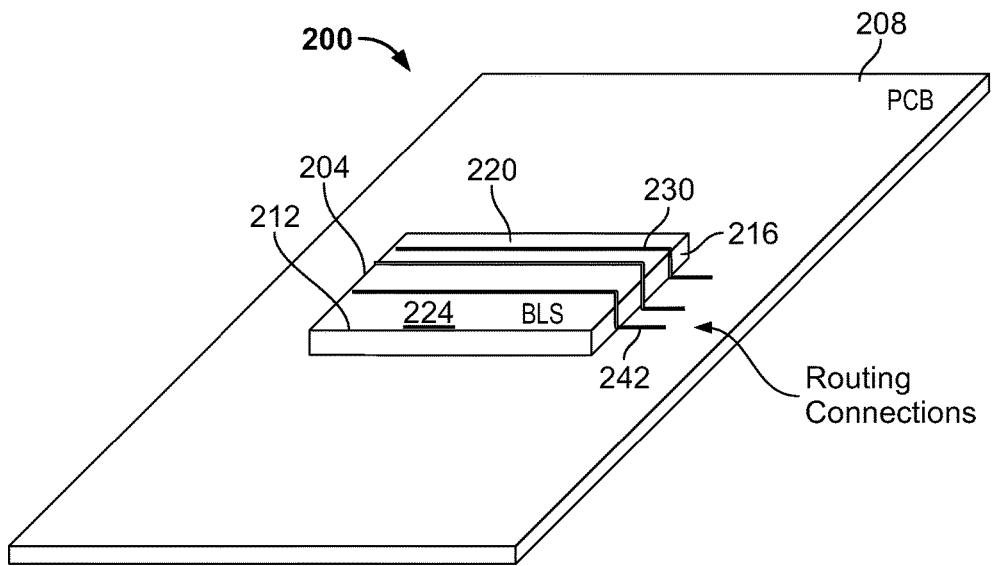
FIG. 2 illustrates an assembly in which there is a multi-layer circuit assembly including routing connections along a portion of a board level shield (BLS) according to an exemplary embodiment.

FIG. 2 illustrates another exemplary embodiment of an assembly 200 for an electronic device such as smartphone, tablet, etc. The assembly 200 includes an electrically conductive structure. In this example, the electrically conductive structure is a board level shield (BLS) 204 attached to a substrate 208 (e.g., a printed circuit board (PCB), etc.). In other embodiments, the electrically conductive structure may comprise a mid-plate, a bracket, a metal precision piece, etc.

As shown in FIG. 2, the BLS 204 includes a cover 212 (broadly, a top or upper surface) and sidewalls 216 depending from (e.g., attached to, integrally connected with, etc.) the cover 212. The sidewalls 216 are configured for installation to the substrate 208 generally about one or more components (not shown) on the substrate 208 such that the component(s) are under the BLS 204 and/or within an interior or shielding enclosure cooperatively defined by the sidewalls 216 and the cover 212. When the BLS 204 is installed (e.g., soldered, etc.) on the substrate 208, the BLS 204 is operable for shielding the component(s) that are within the interior or shielding enclosure cooperatively defined by the sidewalls 216 and the cover 212. The BLS 204 may also serve as a ground plane.

An electrically nonconductive or dielectric material 220 is applied to at least part of one or more outer surfaces 224 of the cover 212 and/or sidewalls 216 of the BLS 204. The dielectric material 220 may be thermally conductive or thermally insulative. One or more electrical components 230 ("first electrical components") are provided at least partly on the nonconductive material 220. The dielectric material 220 may be a relatively thin dielectric coating or layer that is applied via ink jet printing, spraying, painting, etc. The dielectric material 220 (e.g., a dielectric coating, electrical insulation, etc.) provides electrical isolation between the BLS 204 and the electrically conductive material 230. The dielectric material 220 acts as an intermediary between the BLS 204 and the electrically conductive material 230 to prevent direct contact between the BLS 204 and the electrically conductive material 230. By way of example, a dielectric coating may be deposited or dispensed along the outer surface of the BLS 204, e.g., via an ink jet process, print nozzle, or other suitable process. The dielectric coating may then be cured with ultraviolet light, etc. In an exemplary embodiment, the dielectric coating may provide electrical resistance greater than 4 gigaohms at 1000 volts with a 1 mm probe tip diameter and 100 gram weight. The dielectric coating may capable of withstanding or surviving lead-free reflow temperatures, such as a temperature of at least 260 degrees Celsius. (e.g., 300 degrees Celsius., 350 degrees Celsius, etc.). The dielectric coating may comprise a blend of polymers, with acrylate polymers as the primary component, along with other components urethane, polyester and polyvinyl polymers, photo initiators, and other additives, etc. The dielectric coating may be disposed along the entire outer surface of the BLS or along only portions of the outer surface of the BLS. The dielectric coating may have a thickness of about 15 microns, less than 15 microns, or greater than 15 microns. The dielectric coating may be thermally conductive in some exemplary embodiments.

The dielectric material 220 may be provided at least partly along and/or over the outward-facing exposed surface(s) 224 of the BLS 204, such that the dielectric material 220 is situated between the BLS 204 and the first electrical component(s) 230 and provided at least partly on the electrically nonconductive material 220. The dielectric material 220 inhibits the BLS 204 from directly contacting and electrically shorting the first electrical component(s) 230.

In the example, the first electrical component(s) 230 include routing connectors 242 extending, e.g., at least partly across the BLS 204 from one sidewall 216 over the cover 212 to an opposite sidewall 216. The connectors 242 may be patterned on the BLS 204 over the dielectric material 220, e.g., with electrically conductive paint and/or other electrically conductive material. The connectors 242 may be used to route signals and/or to electrically interconnect various electrical components ("second electrical components") (not shown in FIG. 2) including, e.g., component(s) installed directly or indirectly on the PCB 208, installed on another PCB, installed on the BLS 204, installed apart from the PCB 208, installed on other component(s) elsewhere in the circuit assembly 200, etc.

In some exemplary embodiments, the electrically nonconductive or dielectric material 220 may also be thermally conductive. In these exemplary embodiments, the assembly 200 may have a third functionality as it can be used to help define or provide part of a thermally-conductive heat path from a heat source to a heat dissipating device or component (e.g., a heat spreader, a heat sink, a heat pipe, a device exterior case or housing, etc.). For example, a thermally conductive heat path may be defined from one or more heat generating components disposed under the BLS 204 through the BLS cover 212 and/or sidewalls 216 and thermally-conductive dielectric material 220 to a heat dissipating device.

Figure 3:
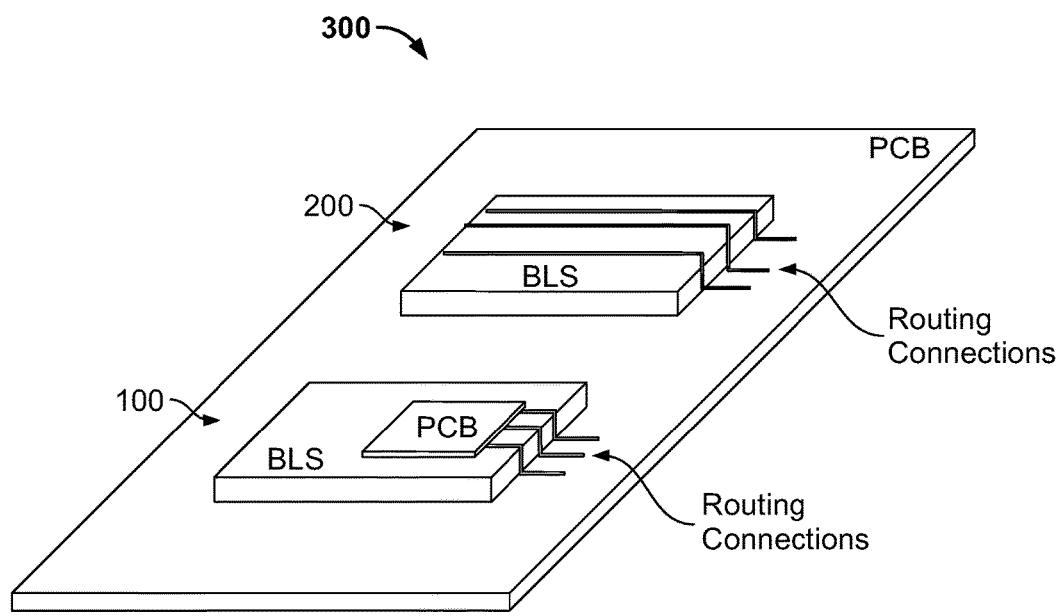
FIG. 3 illustrates an assembly that includes both of the multilayer circuit assemblies shown in FIGS. 1 and 2 according to an exemplary embodiment.

FIG. 3 illustrates another exemplary embodiment of an assembly 300 for an electronic device such as smartphone, tablet, etc. In this example, the assembly 300 includes the assemblies 100 and 200, which are identical or similar to the corresponding assemblies 100 and 200 described above and shown in FIGS. 1 and 2, respectively.

Figure 4:
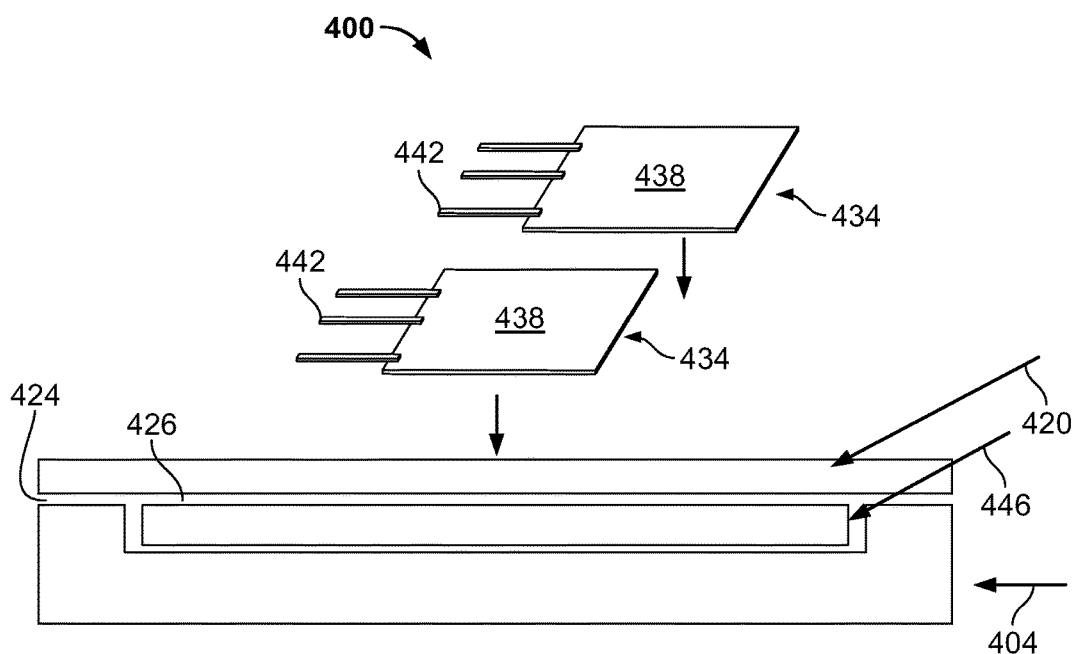
FIG. 4 illustrates a multilayer circuit assembly including flexible circuits aligned for positioning on an electrically nonconductive or dielectric material along a portion of a mid-plate according to an exemplary embodiment.

FIG. 4 illustrates an exemplary embodiment of an assembly 400 for an electronic device such as smartphone, tablet, etc. The assembly 400 includes an electrically conductive structure. In this example, the electrically conductive structure is a mid-plate 404. In other embodiments, the electrically conductive structure may comprise a board level shield (BLS), a bracket, a metal precision piece, etc.

As shown in FIG. 4, a heat spreader 446 (e.g., graphite, etc.) is disposed within a pocket or recessed portions of the mid-plate 404. An electrically nonconductive or dielectric material 420 is applied to at least part of one or more outer surfaces 424 of the mid-plate 404 and/or to at least part of one or more outer surfaces 426 of the heat spreader 446. The electrically nonconductive material 420 may be thermally conductive such that a thermally-conductive heat path is defined through the mid-plate 404, heat spreader 446, and thermally-conductive electrically non-conductive material 420.

Electrically conductive material is provided at least partly on the nonconductive material 420. The electrically conductive material is configured to define at least a portion of a circuit assembly for connection with one or more components of the electronic device. The electrically conductive material may also define and/or be referred to herein as one or more electrical components ("first electrical components").

In this example, the first electrical component(s) include two flexible circuits 434 provided at least in part on flexible PCBs 438. The flexible circuits 434 may be made of materials including, e.g., polyimide film (such as Kapton polyimide, etc.), adhesive, metal foil, etc. Connectors 442 extend outwardly from the flexible PCBs 438. The connectors 442 may be used to electrically connect the flexible circuits 434 with various electrical components ("second electrical components") (not shown in FIG. 4) including, e.g., one or more second electrical components installed directly on a PCB, etc.

The dielectric material 420 may be a relatively thin dielectric coating or layer that is applied via ink jet printing, spraying, painting, etc. The dielectric material 420 (e.g., a dielectric coating, electrical insulation, etc.) electrically isolates the flexible circuits 434 and connectors 442 from the mid-plate 404 and the heat spreader 446. The dielectric material 420 acts as an intermediary to prevent direct contact and electrical shorting of the flexible circuits 434 and connectors 442 with the mid-plate 404 and the heat spreader 446. By way of example, a dielectric coating may be deposited or dispensed along the outer surface of the mid-plate 404, e.g., via an ink jet process, print nozzle, or other suitable process. The dielectric coating may then be cured with ultraviolet light, etc. In an exemplary embodiment, the dielectric coating may provide electrical resistance greater than 4 gigaohms at 1000 volts with a 1 mm probe tip diameter and 100 gram weight. The dielectric coating may capable of withstanding or surviving lead-free reflow temperatures, such as a temperature of at least 260 degrees Celsius (e.g., 300 degrees Celsius, 350 degrees Celsius, etc.). The dielectric coating may comprise a blend of polymers, with acrylate polymers as the primary component, along with other components urethane, polyester and polyvinyl polymers, photo initiators, and other additives, etc. The dielectric coating may be disposed along the entire outer surface of the mid-plate or along only portions of the outer surface of the mid-plate. The dielectric coating may have a thickness of about 15 microns, less than 15 microns, or greater than 15 microns. The dielectric coating may be thermally conductive in some exemplary embodiments.

In some exemplary embodiments, the dielectric material 420 may also be thermally conductive. In these exemplary embodiments, the assembly 400 may have a third functionality as it can be used to help define or provide part of a thermally-conductive heat path from a heat source to a heat dissipating device or component (e.g., a heat spreader, a heat sink, a heat pipe, a device exterior case or housing, etc.). For example, a thermally conductive heat path may be defined from one or more heat sources through the mid-plate 404, heat spreader 446, and thermally-conductive dielectric material 420 to a heat dissipating device.

In various embodiments, a BLS, mid-plate, bracket, precision metal component, etc. disclosed herein may be formed from a wide range of materials, which are preferably electrically conductive materials. For example, a BLS and/or mid-plate may be formed from metals or metal alloys, such as cold rolled steel (e.g., tin-plated cold rolled steel, etc.), sheet metal, stainless steel, copper alloys (e.g., tin-plated copper alloys, etc.), nickel-silver alloys (e.g., nickel-silver alloy 770, etc.), copper-nickel alloys, carbon steel, brass, copper, aluminum, copper-beryllium alloys, phosphor bronze, steel, alloys thereof, among other suitable electrically conductive materials. A BLS and/or mid-plate may also be formed from a plastic material coated with electrically conductive material. In one exemplary embodiment, a BLS and/or mid-plate may be formed from a sheet of nickel-silver alloy having a thickness of about 0.15 millimeters. The materials and dimensions provided herein are for purposes of illustration only, as a BLS and/or a mid-plate disclosed herein may be made from different materials and/or have different dimensions depending, for example, on the particular application, such as electrical components to be shielded, space considerations within the overall electronic device, EMI shielding and heat dissipation needs, and other factors.

Also disclosed are exemplary embodiments of methods relating to making a multiple-layer circuit assembly suitable for use in an electronic device such as a smartphone. One example method generally includes applying an electrically nonconductive material onto at least part of an electrically conductive structure, e.g., a BLS, mid-plate, bracket, precision metal part, etc. In various example methods, dielectric material may be provided over and/or along the outward-facing exposed surface(s) of the electrically conductive structure. The dielectric material inhibits the electrically conductive structure from directly contacting and electrically shorting one or more components as the components would instead contact the dielectric material. Example methods may include depositing a dielectric via ink jet printing, spraying, painting, etc. An exemplary embodiment may include ink jet printing a relatively thin dielectric coating (e.g., 5 microns thick, etc.) and then curing the dielectric coating with ultraviolet light. The dielectric coating may be thermally conductive in some exemplary embodiments.

Apart from being configured (in accordance with the present example method) for use in a multiple-layer circuit assembly, the electrically conductive structure is configured to have a first functionality in the electronic device. For example, as previously mentioned, a BLS may be provided to shield electrical components, and a mid-plate may be provided to separate a smartphone screen from a battery and/or logic board(s). The example method also includes providing one or more first electrical components at least partly on the electrically nonconductive material. The first electrical component(s) are configured for electrical connection with one or more second electrical components provided, e.g., on a substrate. For example, where the electrically conductive structure is a BLS configured for installation on a substrate such as a PCB, the first electrical component(s) may be configured for connection with second electrical component(s) installed on the same PCB. Through performance of the foregoing method, the electrically conductive structure is configured to have a second functionality in addition to the first functionality. For example, a BLS included in a multiple-layer circuit assembly not only may provide shielding, but also may provide support for at least some of the electrical components in the circuit assembly. In this example, the first and second functionalities may thus be considered to be shielding and electrical component support, respectively.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purposes of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An assembly suitable for use in an electronic device, the assembly comprising:
    an electrically conductive structure configured for a first functionality in the electronic device;
    an electrically nonconductive material on at least part of the electrically conductive structure; and
    one or more first electrical components at least partly on the electrically nonconductive material and configured to define at least a portion of a circuit assembly for electrically connecting with one or more second electrical components of the electronic device;
    whereby the electrically conductive structure is configured for a second functionality in addition to the first functionality in the electronic device;
    wherein the one or more first electrical components comprise a flexible circuit on a flexible printed circuit board mounted on a upper surface of the electrically conductive structure, and a pattern of electrically conductive material on the electrically nonconductive material defining one or more routing connections extending from the flexible circuit and along at least one sidewall of the electrically conductive structure, for electrically connecting the circuit with the one or more second electrical components of the electronic device.

2. The assembly of claim 1, wherein the electrically conductive structure comprises one or more of:
    a board level shield (BLS) including a cover and one or more sidewalls depending from the cover and configured for installation to a substrate generally about one or more components on the substrate such that when the board level shield is installed to the substrate, the board level shield is operable for shielding the one or more components that are within an interior cooperatively defined by the cover and the one or more sidewalls; or
    a mid-plate.

3. The assembly of claim 1, wherein the electrically nonconductive material is thermally conductive, and wherein the electrically conductive structure has a third functionality of defining or providing part of a thermally-conductive heat path within the electronic device from a heat source to a heat dissipating device or component.

4. The assembly of claim 1, wherein the electrically conductive structure comprises a board level shield (BLS) including a cover and one or more sidewalls depending from the cover and configured for installation to a substrate generally about one or more components on the substrate such that when the board level shield is installed to the substrate, the board level shield is operable for shielding the one or more components that are within an interior cooperatively defined by the cover and the one or more sidewalls, whereby the first functionality is EMI shielding and grounding and the second functionality is supporting the circuit assembly.

5. The assembly of claim 1, wherein the electrically conductive structure comprises a mid-plate configured such that the first functionality is to provide a ground plane and the second functionality is supporting the circuit assembly.

6. An assembly suitable for use in an electronic device, the assembly comprising:
    an electrically conductive structure configured for a first functionality in the electronic device;
    an electrically nonconductive material on at least part of the electrically conductive structure; and
    one or more first electrical components at least partly on the electrically nonconductive material and configured to define at least a portion of a circuit assembly for electrically connecting with one or more second electrical components of the electronic device;
    whereby the electrically conductive structure is configured for a second functionality in addition to the first functionality in the electronic device;
    wherein the electrically conductive structure comprises a board level shield (BLS) including a cover and one or more sidewalls depending from the cover and configured for installation to a substrate generally about one or more components on the substrate such that when the board level shield is installed to the substrate, the board level shield is operable for shielding the one or more components that are within an interior cooperatively defined by the cover and the one or more sidewalls, whereby the first functionality is EMI shielding and grounding and the second functionality is supporting the circuit assembly; and
    wherein the electrically nonconductive material comprises a layer of electrically nonconductive material along at least a portion of an outer surface of the cover and at least one of the one or more sidewalls of the BLS.

7. The assembly of claim 6, wherein:
    the one or more first electrical components comprise a printed circuit board including a circuit and mounted on the electrically conductive structure; and
    connectors extend from the printed circuit board along at least a portion of the electrically nonconductive material, for electrically connecting the circuit with the one or more second electrical components of the electronic device.

8. The assembly of claim 6, wherein the one or more first electrical components comprise a flexible circuit on a flexible printed circuit board mounted on a upper surface of the electrically conductive structure, and a pattern of electrically conductive material on the electrically nonconductive material defining one or more routing connections extending from the flexible circuit and along at least one sidewall of the electrically conductive structure, for electrically connecting the circuit with the one or more second electrical components of the electronic device.

9. The assembly of claim 6, wherein the one or more first electrical components comprise a pattern of electrically conductive material on the electrically nonconductive material defining one or more routing connections extending at least partly across the electrically conductive structure from one sidewall of the electrically conductive structure, over an upper surface of the electrically conductive structure to an opposite sidewall of the electrically conductive structure.

10. The assembly of claim 6, wherein the one or more first electrical components comprise routing connectors extending at least partly across an upper surface of the electrically conductive structure and along at least one sidewall of the electrically conductive structure, for electrically connecting the circuit with the one or more second electrical components of the electronic device.

11. An assembly suitable for use in an electronic device, the assembly comprising:
an electrically conductive structure configured for a first functionality in the electronic device;
an electrically nonconductive material on at least part of the electrically conductive structure; and
one or more first electrical components at least partly on the electrically nonconductive material and configured to define at least a portion of a circuit assembly for electrically connecting with one or more second electrical components of the electronic device;
whereby the electrically conductive structure is configured for a second functionality in addition to the first functionality in the electronic device;
wherein the electrically conductive structure comprises a board level shield (BLS) including a cover and one or more sidewalls depending from the cover and configured for installation to a substrate generally about one or more components on the substrate such that when the board level shield is installed to the substrate, the board level shield is operable for shielding the one or more components that are within an interior cooperatively defined by the cover and the one or more sidewalls, whereby the first functionality is EMI shielding and grounding and the second functionality is supporting the circuit assembly; and
wherein the electrically nonconductive material comprises a layer of electrically nonconductive material between the one or more first electrical components and an outer surface of the cover and at least one of the one or more sidewalls of the BLS.

12. An assembly suitable for use in an electronic device, the assembly comprising:
an electrically conductive structure configured for a first functionality in the electronic device;
an electrically nonconductive material on at least part of the electrically conductive structure; and
one or more first electrical components at least partly on the electrically nonconductive material and configured to define at least a portion of a circuit assembly for electrically connecting with one or more second electrical components of the electronic device;
whereby the electrically conductive structure is configured for a second functionality in addition to the first functionality in the electronic device;
wherein:
the electrically conductive structure comprises a board level shield (BLS) including a cover and one or more sidewalls depending from the cover and configured for installation to a substrate generally about one or more components on the substrate such that when the board level shield is installed to the substrate, the board level shield is operable for shielding the one or more components that are within an interior cooperatively defined by the cover and the one or more sidewalls, whereby the first functionality is EMI shielding and grounding and the second functionality is supporting the circuit assembly;
the cover is removable from and reattachable to the one or more sidewalls;
the electrically nonconductive material is directly on at least a portion of an outer surface of the cover and at least one of the one or more sidewalls of the BLS; and
the one or more first electrical components are directly on at least a portion of the electrically nonconductive material.

13. An assembly suitable for use in an electronic device, the assembly comprising:
an electrically conductive structure configured for a first functionality in the electronic device;
an electrically nonconductive material on at least part of the electrically conductive structure; and
one or more first electrical components at least partly on the electrically nonconductive material and configured to define at least a portion of a circuit assembly for electrically connecting with one or more second electrical components of the electronic device;
whereby the electrically conductive structure is configured for a second functionality in addition to the first functionality in the electronic device;
wherein:
the electrically conductive structure comprises a mid-plate including a recessed portion;
a heat spreader is disposed within the recessed portion of the mid-plate;
the electrically nonconductive material is along at least a portion of one or more outer surfaces of the mid-plate, the electrically nonconductive material is thermally conductive such that a thermally-conductive heat path is defined through the mid-plate, the heat spreader, and the thermally-conductive electrically non-conductive material; and
the one or more first electrical components comprise one or more printed circuit boards including circuits; and
connectors extend outwardly from the one or more printed circuit boards, for electrically connecting the circuit with the one or more second electrical components of the electronic device.

14. An electronic device comprising the assembly of claim 1, a printed circuit board (PCB), wherein the one or more second electrical components are on the PCB, and wherein the one or more first electrical components are electrical connected with the one or more second electrical components on the PCB.

15. A method of making a circuit assembly suitable for use in an electronic device, the method comprising:

applying an electrically nonconductive material on at least part of an electrically conductive structure, the electrically conductive structure configured to have a first functionality in the electronic device;

providing one or more first electrical components at least partly on the electrically nonconductive material; and configuring the one or more first electrical components for electrical connection with one or more second electrical components of the electronic device;

whereby the electrically conductive structure is configured to have a second functionality in addition to the first functionality;

wherein applying the electrically nonconductive material comprises applying the electrically nonconductive material along at least a portion of an upper surface of the electrically conductive structure and along at least a portion of one or more sidewalls of the electrically conductive structure depending from the upper surface by one or more of:
  printing at least part of the electrically nonconductive material; or
  spraying at least part of the electrically nonconductive material; or
  painting at least part of the electrically nonconductive material.

16. The method of claim 15, wherein providing the one or more first electrical components comprises:
  installing a flexible circuit on the electrically nonconductive material; and
  patterning a top surface of the electrically nonconductive material with electrically conductive paint to thereby define one or more routing connections extending from the flexible circuit along the electrically conductive structure, for electrical connection with one or more second electrical components of the electronic device.

17. The method of claim 15, wherein configuring the one or more first electrical components for electrical connection comprises configuring the one or more first electrical components as routing connectors that extend at least partly across an upper surface of the electrically conductive structure and along at least one sidewall of the electrically conductive structure, for electrical connection with one or more second electrical components of the electronic device.

18. The method of claim 15, wherein the electrically conductive structure comprises a board level shield (BLS) including a cover and one or more sidewalls depending from the cover and configured for installation to a substrate generally about one or more components on the substrate such that when the board level shield is installed to the substrate, the board level shield is operable for shielding the one or more components that are within an interior cooperatively defined by the cover and the one or more sidewalls, whereby the first functionality is EMI shielding and grounding and the second functionality is supporting the circuit assembly.

19. A method of making a circuit assembly suitable for use in an electronic device, the method comprising:
  applying an electrically nonconductive material on at least part of an electrically conductive structure, the electrically conductive structure configured to have a first functionality in the electronic device;
  providing one or more first electrical components at least partly on the electrically nonconductive material; and
  configuring the one or more first electrical components for electrical connection with one or more second electrical components of the electronic device;
  whereby the electrically conductive structure is configured to have a second functionality in addition to the first functionality;
  wherein:
    the electrically conductive structure comprises a board level shield (BLS) including a cover and one or more sidewalls depending from the cover and configured for installation to a substrate generally about one or more components on the substrate such that when the board level shield is installed to the substrate, the board level shield is operable for shielding the one or more components that are within an interior cooperatively defined by the cover and the one or more sidewalls, whereby the first functionality is EMI shielding and grounding and the second functionality is supporting the circuit assembly;
    applying the electrically nonconductive material comprises applying the electrically nonconductive material directly on at least a portion of an outer surface of the cover and at least one of the one or more sidewalls of BLS; and
    providing the one or more first electrical components comprises providing the one or more first electrical components directly on at least a portion of the electrically nonconductive material.

20. The method of claim 19, wherein applying the electrically nonconductive material comprises applying the electrically nonconductive material along at least a portion of an upper surface of the electrically conductive structure and along at least a portion of one or more sidewalls of the electrically conductive structure depending from the upper surface by one or more of:
  printing at least part of the electrically nonconductive material; or
  spraying at least part of the electrically nonconductive material; or
  painting at least part of the electrically nonconductive material.

* * * * *